(12) United States Patent
Mason et al.

(10) Patent No.: US 11,956,898 B2
(45) Date of Patent: Apr. 9, 2024

(54) THREE-DIMENSIONAL (3D) COPPER IN PRINTED CIRCUIT BOARDS

(71) Applicant: Apple Inc., Cupertino, TX (US)

(72) Inventors: Anne M. Mason, Palo Alto, CA (US); Chad O. Simpson, San Jose, CA (US); William Hannon, San Jose, CA (US); Mark J. Beesley, Carmel Valley, CA (US)

(73) Assignee: Apple Inc., Cupertino, CA (US)

( * ) Notice: Subject to any disclaimer, the term of this patent is extended or adjusted under 35 U.S.C. 154(b) by 154 days.

(21) Appl. No.: 17/119,126

(22) Filed: Dec. 11, 2020

(65) Prior Publication Data

US 2022/0095455 A1  Mar. 24, 2022

Related U.S. Application Data

(60) Provisional application No. 63/082,284, filed on Sep. 23, 2020.

(51) Int. Cl.
*H05K 1/11* (2006.01)
*H05K 3/00* (2006.01)
*H05K 3/42* (2006.01)

(52) U.S. Cl.
CPC .......... *H05K 1/115* (2013.01); *H05K 3/0047* (2013.01); *H05K 3/422* (2013.01); *H05K 3/423* (2013.01); *H05K 2201/09536* (2013.01); *H05K 2201/0959* (2013.01); *H05K 2201/096* (2013.01); *H05K 2203/107* (2013.01)

(58) Field of Classification Search
CPC ......... H05K 1/113–116; H05K 1/0265; H05K 1/09854; H05K 2201/09536; H05K 2201/0959; H05K 2201/096; H05K 2201/09563; H05K 2201/098; H05K 2201/09609; H05K 2201/09618; H05K 2201/09372; H05K 2201/09854; H05K 2201/09627; H05K 3/0047; H05K 3/422; (Continued)

(56) References Cited

U.S. PATENT DOCUMENTS 5,533,841 A * 7/1996 Iwano ................. H05K 3/0052
                                                700/192
6,280,641 B1   8/2001 Gaku et al.
(Continued)

*Primary Examiner* — Roshn K Varghese
(74) *Attorney, Agent, or Firm* — Kowert, Hood, Munyon, Rankin & Goetzel, P.C.; Gareth M. Sampson; Dean M. Munyon

(57) ABSTRACT

Structures that implement three-dimensional (3D) conductive material (e.g., copper) in printed circuit boards (PCBs) are disclosed. 3D (three-dimensional) conductive material may include trenches and/or buried vias that are filled with conductive material in the PCBs. Trenches may be formed in build-up layers of a PCB by overlapping multiple laser drilled vias. The trenches may be filled with conductive material using electroplating process(es). Buried vias may be formed through the core layers of the PCB by mechanical drilling. The buried via may be filled with solid conductive material using a combination of electroless plating and electrolytic plating of conductive material. Various PCB structures are disclosed that implement combinations of these trenches and/or these buried vias filled with conductive material.

17 Claims, 11 Drawing Sheets

(58) Field of Classification Search
CPC .... H05K 3/4688; H05K 3/4602; H05K 3/423; H05K 2203/107
See application file for complete search history.

(56) References Cited

U.S. PATENT DOCUMENTS

| | | | |
|---|---|---|---|
| 7,279,412 B2 | 10/2007 | Mok et al. | |
| 7,847,197 B2* | 12/2010 | Oikawa | H05K 1/0265 |
| | | | 174/262 |
| 9,674,937 B2* | 6/2017 | Park | H05K 1/0298 |
| 10,349,531 B2 | 7/2019 | Miyamoto et al. | |
| 2007/0107933 A1* | 5/2007 | Yamamoto | H05K 1/113 |
| | | | 174/262 |
| 2009/0000812 A1* | 1/2009 | Kariya | H05K 1/115 |
| | | | 174/260 |
| 2010/0212947 A1* | 8/2010 | Yamanaka | H05K 1/115 |
| | | | 174/250 |
| 2011/0209905 A1* | 9/2011 | Morita | H05K 1/0222 |
| | | | 174/257 |
| 2015/0181703 A1* | 6/2015 | Tanaka | H05K 1/0298 |
| | | | 174/251 |
| 2018/0279474 A1* | 9/2018 | Hibino | H05K 3/421 |
| 2019/0096814 A1* | 3/2019 | Wang | H01L 23/3107 |

* cited by examiner

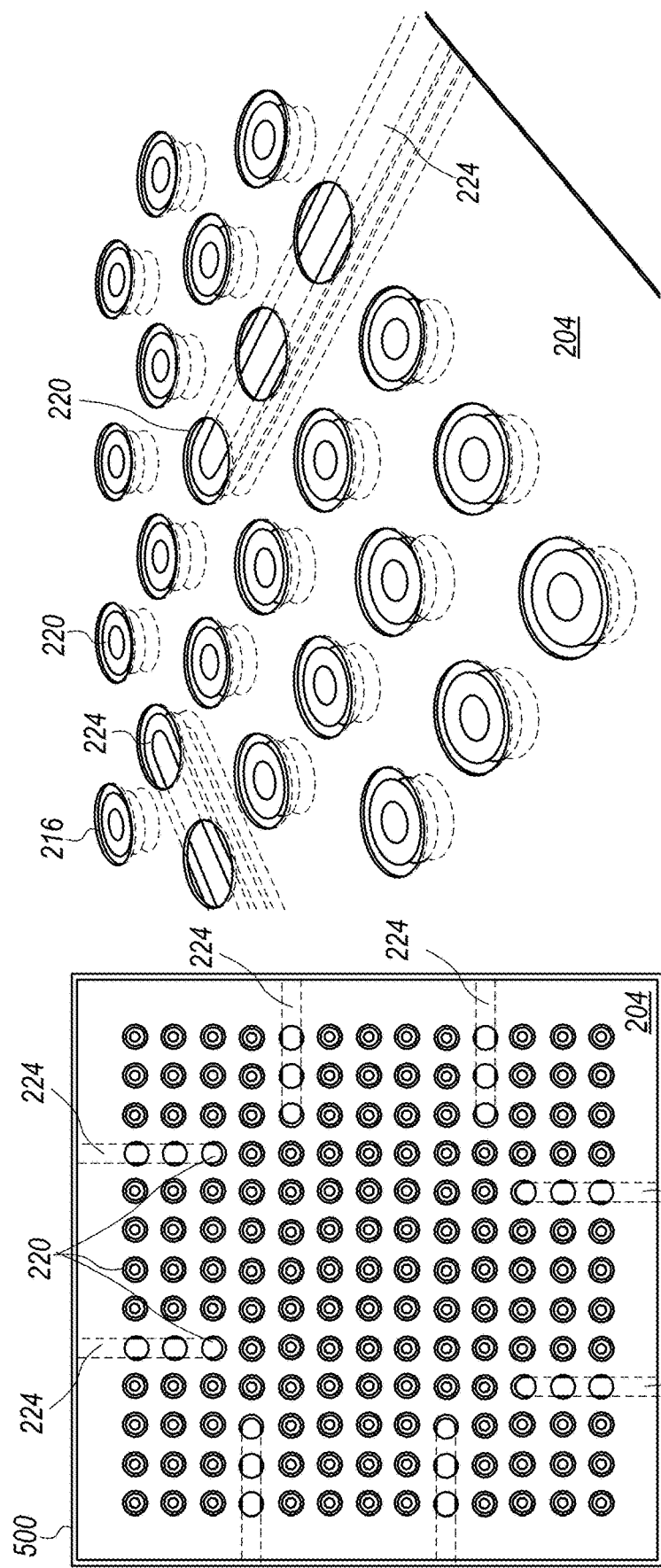

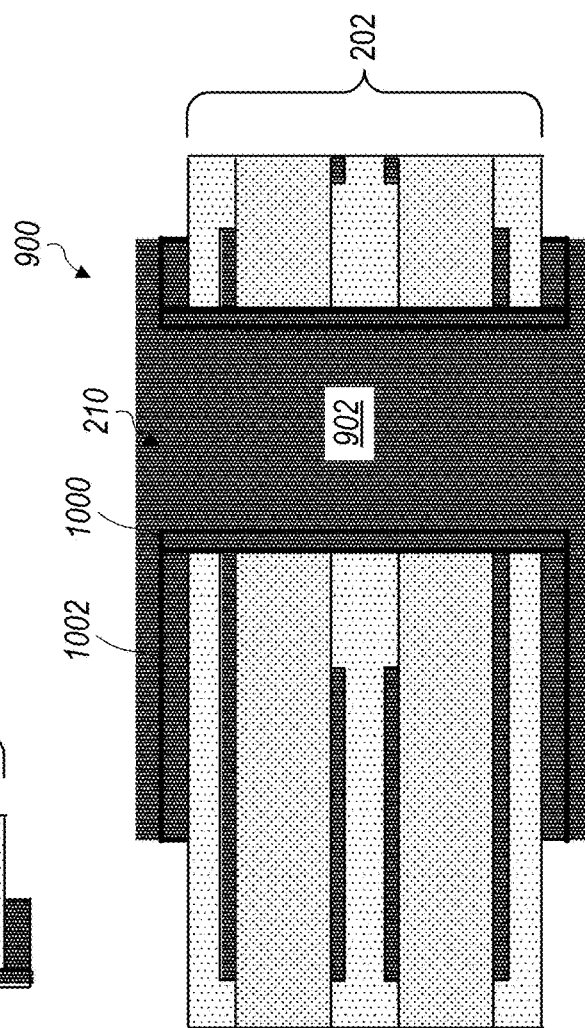
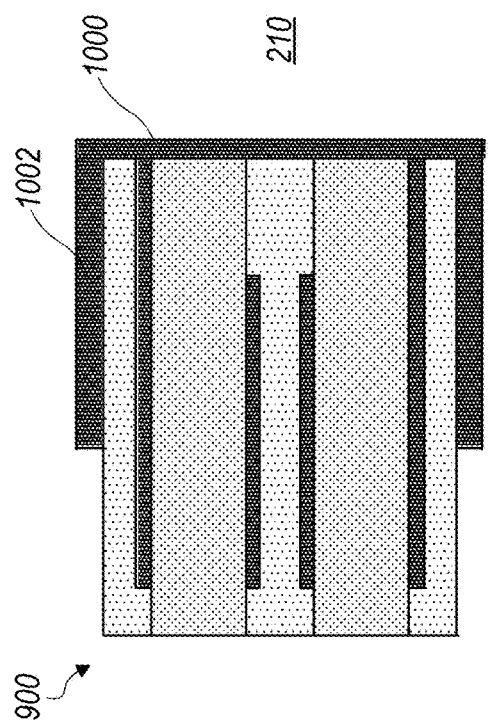
FIG. 10
FIG. 11

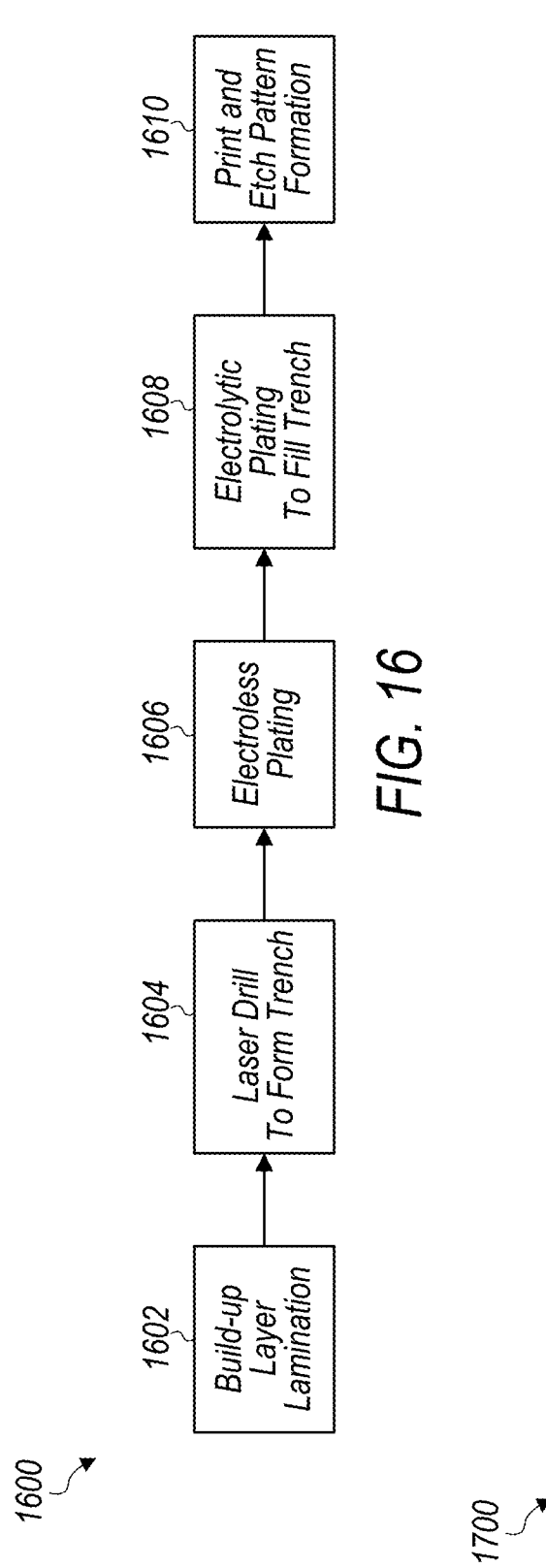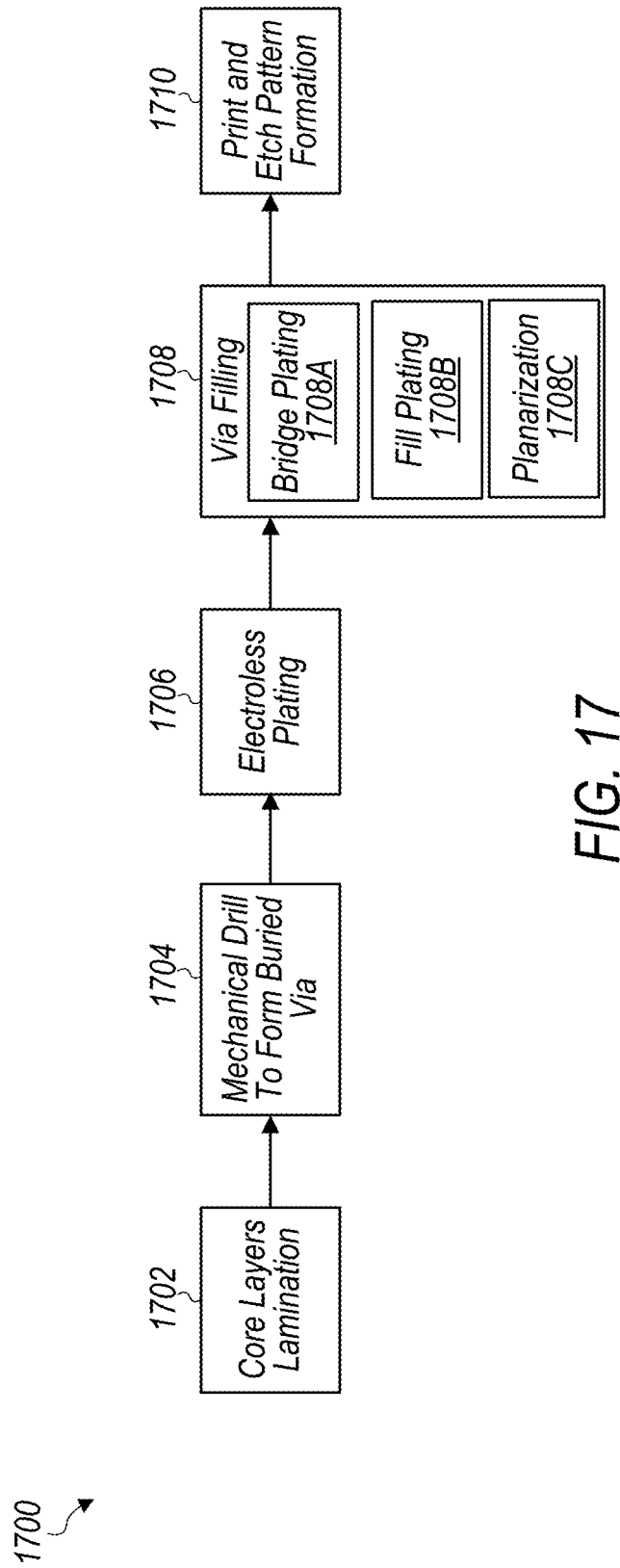

THREE-DIMENSIONAL (3D) COPPER IN PRINTED CIRCUIT BOARDS

PRIORITY CLAIM

This patent claims priority to U.S. Provisional Patent Application No. 63/082,284 to Mason et al., entitled "Three-Dimensional (3D) Copper in Printed Circuit Boards", filed Sep. 23, 2020, which is incorporated by reference in its entirety.

BACKGROUND

Technical Field

Embodiments described herein relate to printed circuit boards. More particularly, embodiments described herein relate to internal interconnections using trenches and buried vias in printed circuit boards.

Description of the Related Art

Printed circuit boards (PCBs), which may include, but not limited to, rigid PCBs, flexible PCBs, rigid flexible PCBs, IC (integrated circuit) substrates, ceramic substrates, etc., are used in a variety of applications involving integrated circuits. Integrated circuits used with PCBs may include, for example, PMICs (power management integrated circuits), SoCs (system on chips), CPUs (central processing units), and GPUs (graphics processing unit). Many processors are being migrated to low voltage, high current technologies. Delivering power from power regulators or PMICs across PCBs for these low voltage, high current processors is, however, challenging in conventional PCB architecture and design.

Examples of challenges may include: 1) circuit electrical current demand is increasing; 2) circuit size is decreasing; 3) current density is increasing; 4) PCBs need greater copper cross sectional area in the same volume of PCB space; and 5) current density in the copper has to remain within the maximum current density limits for functionality, reliability, and thermal reasons. To handle power delivery for these newer technologies, PCBs must handle increased current. With increased current, higher copper densities are needed in PCBs. With increased current density, PCBs need to maintain current carrying capacity to stay within maximum current density limits for functionality, reliability, and thermal reasons. Current density in a PCB is the amount of current in amps divided by the amount of copper cross-sectional area (typically millimeters squared or micrometers squared). Thus, to increase current carrying capacity while staying within maximum current density limits, the amount of copper cross-section area in the PCBs needs to be increased.

Standard PCB technology enables x- and y-interconnections with copper traces on a PCB layer through pattern imaging and etching. The traces, along with vertical connections to the traces, are used to carry signals across PCB. Layer-to-layer (z-axis) connections (e.g., vertical connections) are typically implemented through either a mechanical drilled and plated via (for connecting multiple layers) or a laser drilled and plated via (for connecting adjacent layers). For traces in the x- and y-planes, current carrying capacity and direct current (DC) resistance is limited by the available copper width and the thickness of the copper plane. The present industry practice solution is to use a thicker copper plane. The thicker the plane, however, the more limited design rule is available for trace width and trace to trace spacing. Thicker planes also require thicker adjacent insulating dielectric planes to conform to the etched copper features. These standard industry methods of achieving higher current capacity work against the goal of minimizing the volume of the PCB. For z-axis connections (either mechanical or laser drilled), the cross-sectional area of the copper may be limited by the thickness of the plane, thus limiting the volume of copper plating that can be achieved inside the drill hole. Mechanical drilled vias are typically larger diameter vias plated with a thin (e.g., about 20 micrometers) copper layer along the walls of the vias and not fully filled with copper. Laser drilled vias are typically filled full with copper but are smaller in diameter (e.g., less than about 100 micrometers) and funnel shaped.

FIG. 1 depicts a cross-sectional side-view representation of an example of a prior art PCB. PCB 100 includes core layers 102 and build-up layers 104 on both sides of the core layer. Via 106 is a mechanical drilled via plated with copper 108 along the wall of the via. Copper 108 is connected to copper 109 that forms an annular ring around via 106. Vias 110 are laser drilled vias filled with plated copper 112 between copper pads 114. Copper 112 connects to copper 109 in the annular ring around via 106 to provide connection between copper 108 in via 106 and copper 112 in vias 110. As shown in FIG. 1, vias 110 and copper 112 are staggered with respect to via 106 to allow connection between copper 112 and copper 109 in the annular ring. Additionally, the limits in the cross-sectional areas for copper 108, copper 109, copper 112, and copper pads 114 directly affects DC resistance of the interconnects in via 106 and vias 110.

Higher PCB current density requirements have typically been satisfied by interconnecting horizontal layers of copper in the build-up layers with laser drilled vias (e.g., laser drilled and copper plated vias). Insulating dielectric layers, which do not carry current, are also placed between the horizontal layers of copper. If the combined layers and vias of copper cannot together achieve the required copper cross-sectional areas for current delivery in the PCBs, designers may have to implement higher numbers of layers in the PCBs and PCB architecture, which typically drives up PCB thickness, requiring more material and process steps, thereby creating longer lead-times and higher costs for fabrication.

SUMMARY 3D (three-dimensional) conductive material (e.g., copper) trenches and/or conductive material filled buried vias in printed circuit boards (PCBs) are described. Trenches may be formed in dielectric layers in build-up layers of the PCB by overlapping multiple laser drilled vias. The trenches formed may be, for example, rectangular or rectilinear in shape. The trenches may be filled with solid conductive material using a combination of electroless plating and electrolytic plating of conductive material. The trenches provide a large conductive material cross section inside the build-up layers, which allows for better greater current carrying capacity and lower DC resistance.

Buried vias may be formed through the core layer of the PCB using mechanical drilling (which has a larger diameter than laser drilling). In certain embodiments, the buried via is filled with solid conductive material using a combination of electroless plating and electrolytic plating. Filling the buried via completely with conductive material reduces resistance through the buried via and also provides greater mechanical strength and greater thermal conductivity in the core layers.

The mechanical strength may also allow for stacking of conductive material-filled laser drilled vias on top of the buried via and/or stacking trenches on top of the buried via.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which:

FIG. 5 depicts a top-view representation of an embodiment of a PCB with trenches fanning out from vias in a build-up layer.

FIG. 6 depicts an angle-view representation of the embodiment depicted in FIG. 5.

FIG. 10 depicts a cross-sectional side-view representation of an embodiment of a core layer in a PCB.

FIG. 11 depicts a cross-sectional side-view representation of an embodiment of a core layer filled with conductive material in a PCB.

FIG. 16 is a flow diagram illustrating a method for forming a trench filled with conductive material in a build-up layer, according to some embodiments.

FIG. 17 is a flow diagram illustrating a method for filling a buried via with conductive material in a core layer, according to some embodiments.

Figure 1:
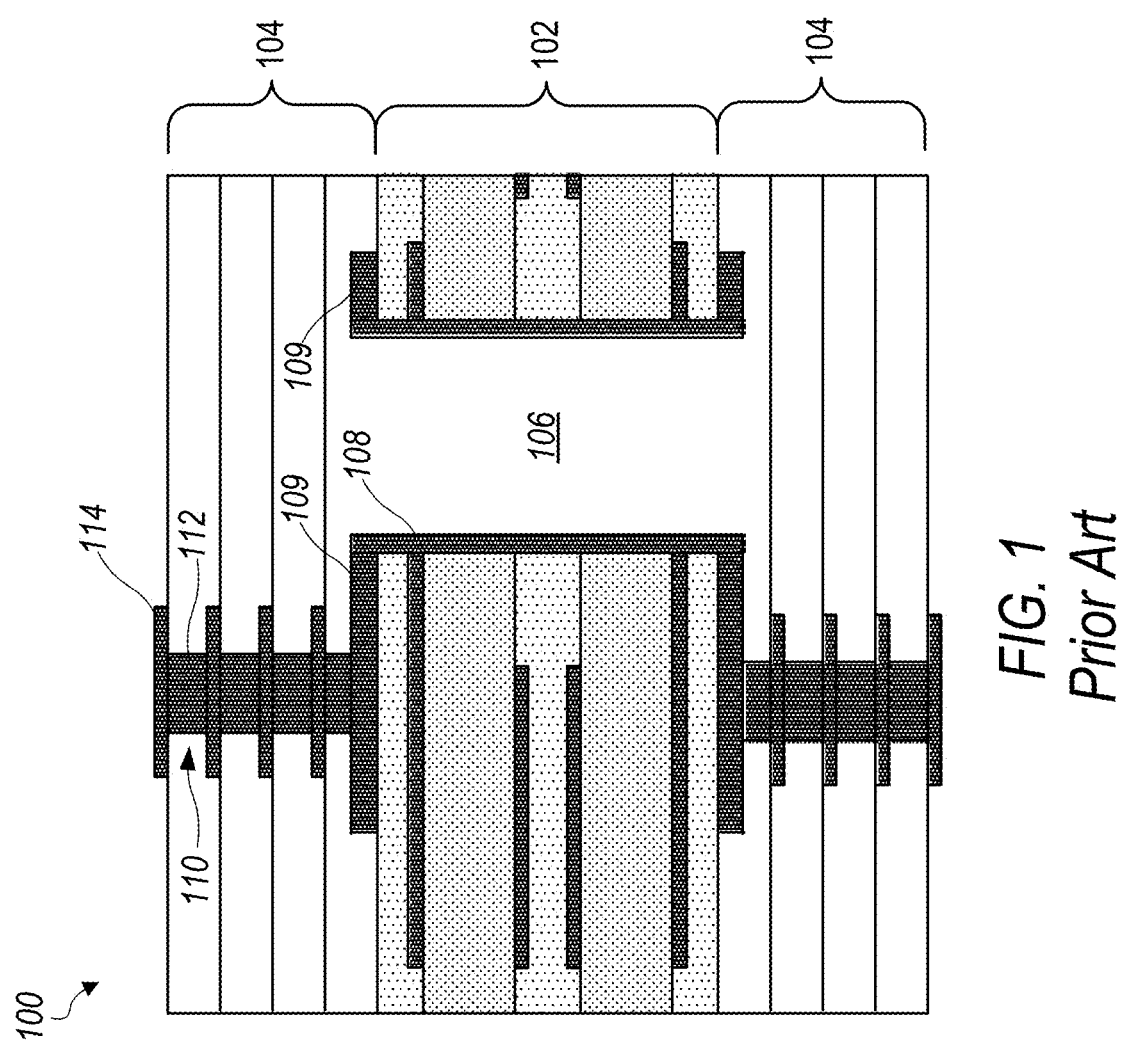
FIG. 1 depicts a cross-sectional side-view representation of an example of a prior art printed circuit board (PCB).

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

DETAILED DESCRIPTION OF EMBODIMENTS

Figure 2:
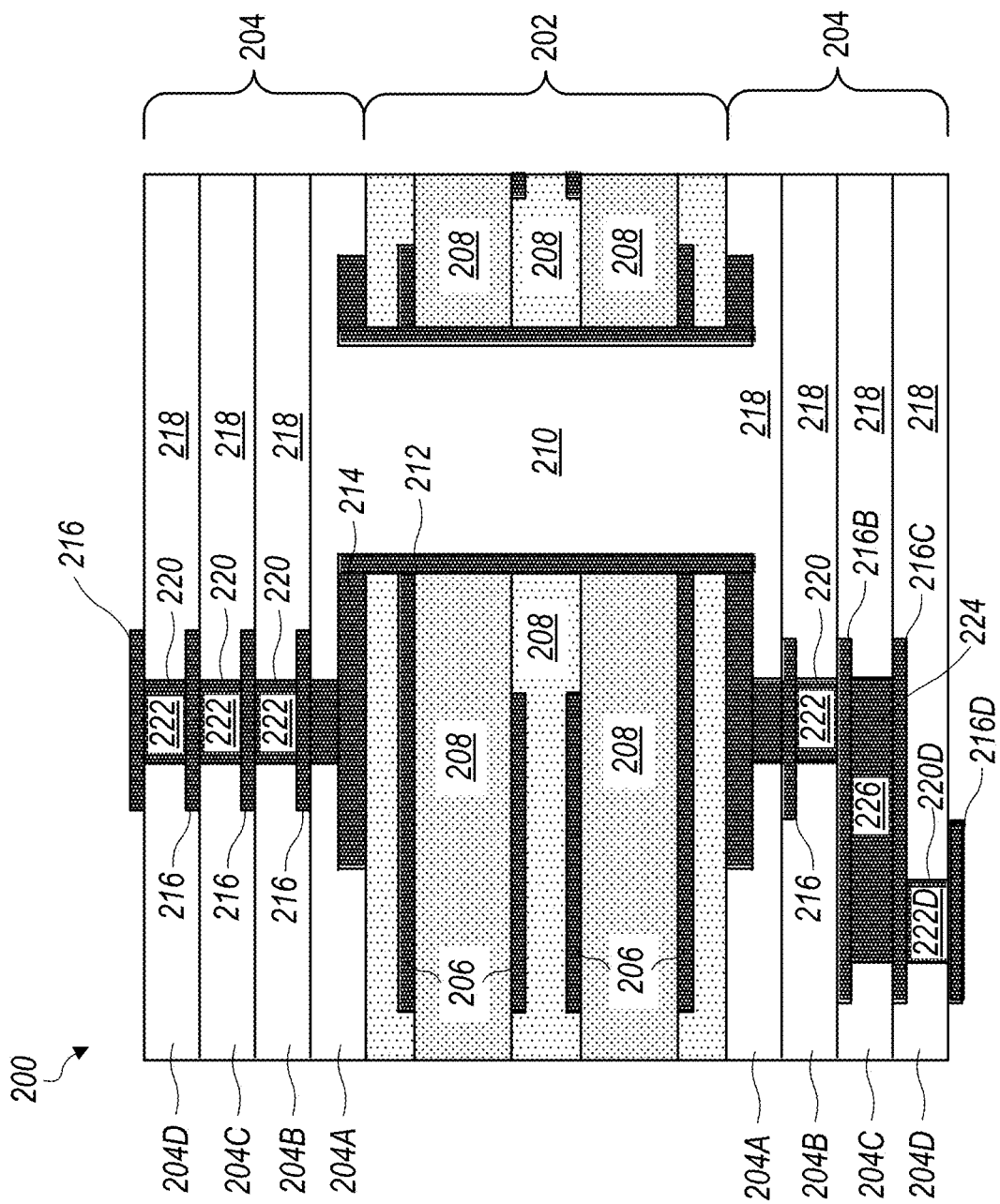
FIG. 2 depicts a cross-sectional side-view representation of an embodiment of a printed circuit board (PCB) with a trench in a build-up layer.

FIG. 2 depicts a cross-sectional side-view representation of an embodiment of a printed circuit board (PCB) with a trench in a build-up layer. As used herein, a PCB (e.g., PCB 200) may include any circuit board that mechanically supports and electrically connects electrical or electronic components using conductive features or components. Examples of PCBs include, but are not limited to, rigid PCBs, flexible PCBs, rigid flexible PCBs, IC (integrated circuit) substrates, and ceramic substrates. In certain embodiments, PCB 200 includes core layers 202 and build-up layers 204 on both sides of the core layers. In the illustrated embodiment, PCB 200 includes four build-up layers 204A, 204B, 204C, and 204D. In some embodiments, PCB 200 has between 3 and 5 build-up layers 204. The number of build-up layers 204 in PCB 200 may, however, vary depending on the electrical and mechanical design parameters of the PCB.

Core layers 202 may include one or more conductive material layers 206 separated by dielectric layers 208. Conductive material layers 206 may be, for example, copper layers such as copper plane layers. As used herein, the term "conductive material" refers to any material that is both electrically and thermally conductive. In certain embodiments described herein, the conductive material is copper but other conductive materials may also be contemplated. Examples of other contemplated conductive materials include, but are not limited to, silver, conductive epoxy, conductive pastes, and other metals. Dielectric layers 208 may be, for example, prepreg layers or core layers. In some embodiments, core layers 202 have a thickness of between about 300 µm and about 500 µm.

In certain embodiments, via 210 is formed through core layers 202. Via 210 may be a blind via (through some but not all core layers 202) or a buried via through all core layers 202. In some embodiments, via 210 is formed by mechanical drilling through core layers 202. Via 210 may have a diameter of between about 160 µm and about 240 µm. In the illustrated embodiment, the wall of via 210 is lined with conductive material layer 212. In certain embodiments, conductive material layer 212 is a copper layer. Conductive material layer 212 may be formed by a plating process such as electroplating. Conductive material layer 212 may have a thickness between about 5 μm and about 20 μm. In some embodiments, conductive material layer 212 extends beyond the edges of via 210 and forms annular ring 214. The formation of annular ring 214 may occur during the plating process of conductive material layer 212.

In certain embodiments, build-up layers 204 include one or more conductive material layers 216 separated by dielectric layers 218. Conductive material layers 216 may be, for example, conductive material foil layers such as copper foil layers. Dielectric layers 218 may be fiberglass epoxy layers or other dielectric material layers. In some embodiments, build-up layers 204 have thicknesses that vary between about 40 μm and about 60 μm.

In the depicted embodiment, vias 220 are formed in one or more of build-up layers 204 to connect to conductive material layers 216. Vias 220 may connect conductive material layers 216 to each other or conductive material layers 216 to another conductive material layer (e.g., annular ring 214 of conductive material layer 212). In certain embodiments, vias 220 are formed by laser drilling through build-up layers 204. Laser drilled vias are typically smaller in diameter than mechanical drilled vias and may have a conical shape. In some embodiments, vias 220 have diameters between about 75 μm and about 100 μm. In some embodiments, vias 220 have diameters between about 50 μm and about 150 μm. Vias 220 may be filled with conductive material 222. Conductive material 222 may be filled in vias 220 by, for example, a plating process, such as electroplating, or by using epoxy resin with conductive material.

Figure 3:
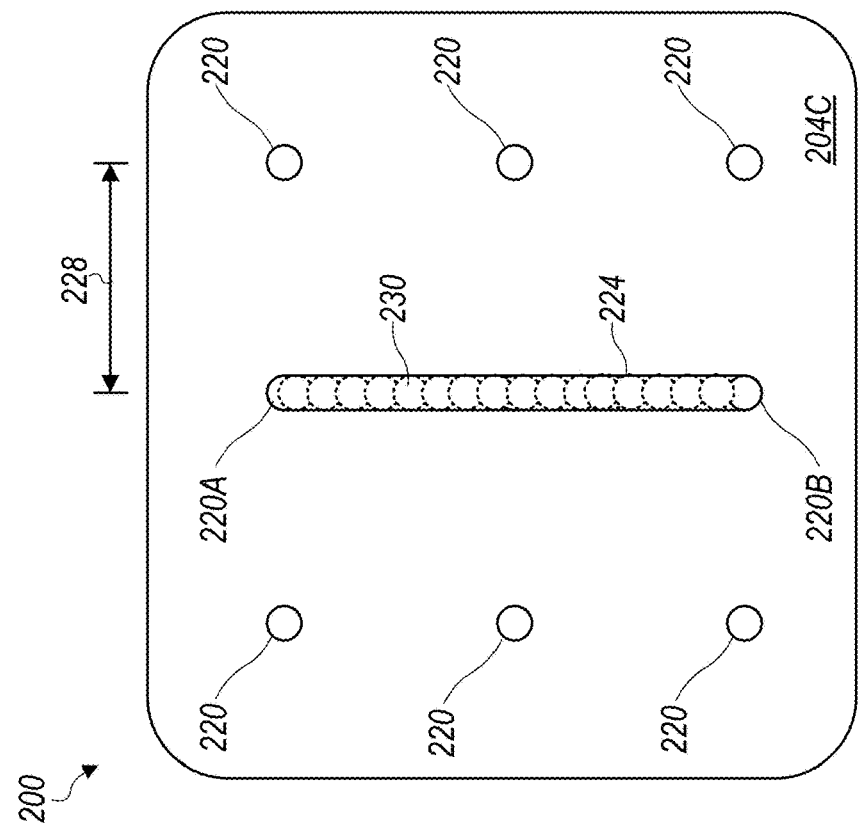
FIG. 3 depicts a top-view representation of an embodiment of a PCB with a trench in a build-up layer.

In certain embodiments, a trench filled with conductive material may be formed in one or more build-up layers 204, as shown in FIG. 3. For example, in the illustrated embodiment, trench 224 is formed in build-up layer 204C and filled with conductive material 226. In some embodiments, trench 224 is formed by overlapping a plurality of vias (e.g., laser drilled vias) in build-up layer 204C. FIG. 3 depicts a top-view representation of an embodiment of PCB 200 with trench 224 in build-up layer 204C. Build-up layer 204C includes a plurality of vias 220. Vias 220 may be spaced by distance 228. In some embodiments, distance 228 is between about 300 μm and about 500 μm.

In the illustrated embodiment, trench 224 is formed between via 220A and via 220B in build-up layer 204C. Trench 224 may be formed by overlapping vias 230 (shown with dashed lines). In certain embodiments, vias 230 are formed by laser drilling the vias. Vias 230 may have the same dimensions as vias 220 (e.g., vias 230 are formed using the same laser drilling system as vias 220). Thus, vias 230 may have diameters between about 75 μm and about 100 μm or between about 50 μm and about 150 μm.

In certain embodiments, overlapping vias 230 form trench 224 in a rectilinear shape. For example, trench 224 may have a rectangular shape. Embodiments with other shapes may, however, be contemplated. For example, any shape that may be formed by overlapping circular vias 230 may be contemplated. For a rectangular trench, trench 224 may have a width of vias 230 (e.g., between about 50 μm and about 150 μm) with a length determined by design needs of PCB 200. For example, trench 224 may have lengths on the order of millimeters or tens of millimeters.

Figure 4:
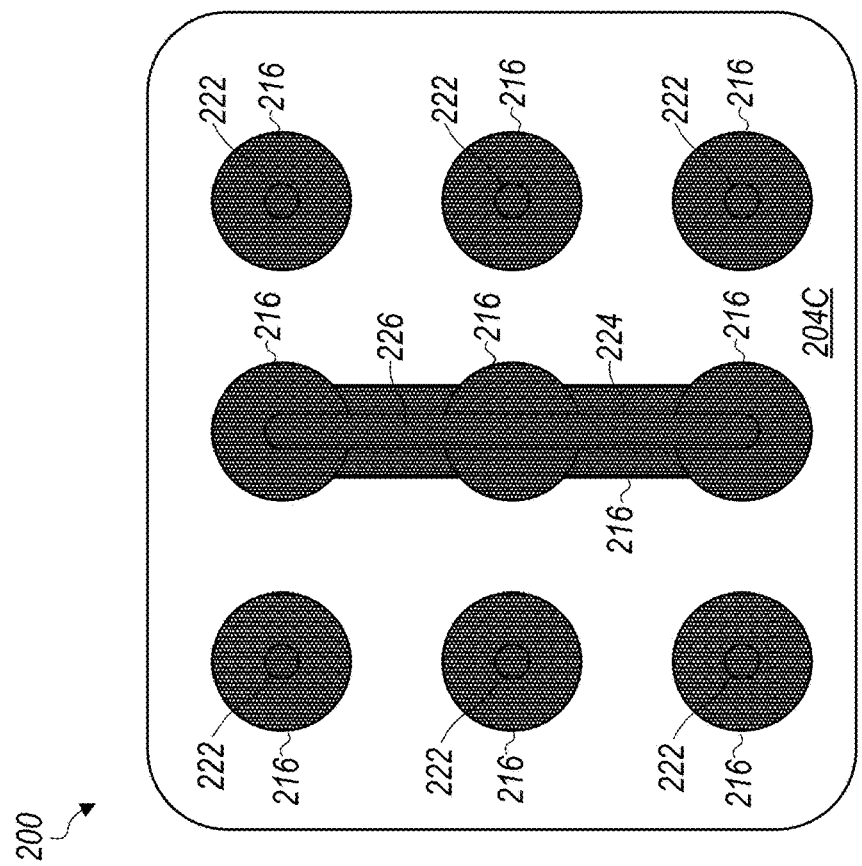
FIG. 4 depicts a top-view representation of an embodiment of a PCB with a trench filled with conductive material.

After forming vias 230 (and thus trench 224) in build-up layer 204C, vias 230 and trench 224 may be filled with conductive material 226. FIG. 4 depicts a top-view representation of an embodiment of PCB 200 with trench 224 filled with conductive material 226. Examples of conductive material 226 filling trench 224 include, but are not limited to, electroplated copper, electroless copper, copper paste, silver paste, or any other conductive material. In certain embodiments, as described herein, a seed layer of conductive material 226 is plated along the walls of trench 224 using electroless plating. The seed layer may have a thickness of between about 0.1 μm and about 100 μm. Trench 224 may then be filled (e.g., substantially filled) with conductive material 226 using electrolytic plating. Electrolytic plating may be possible because of the seed layer of conductive material while also being faster and more efficient in substantially filling trench 224 with conductive material 226 than electroless plating.

As described herein, "substantially" filling trench 224 with conductive material 226 includes filling the trench such that the conductive material is flat as possible in the trench (e.g., the top of the conductive material is flat as possible at or near the top of the trench). In certain embodiments, substantially filling trench 224 with conductive material 226 includes limiting or reducing a dimple or recess at the top of the conductive material. For example, a size of the dimple at the top of conductive material 226 may have a maximum allowable size. In some embodiments, the maximum allowable size of a dimple is about 15 μm, though the allowable size may vary based on the design parameters of PCB 200.

As shown in FIG. 4, conductive material layers 216 and conductive material 222 may also be deposited on build-up layer 204C in addition to conductive material 226. As described above, conductive material 222 may be electroplated conductive material and conductive material layers 216 may be foil. Deposition of conductive material layers 216 and conductive material 222 may be at the same time as conductive material 226 is formed or at different times before or after conductive material 226 is formed.

In some embodiments, as shown in FIGS. 3 and 4, trench 224 is formed between two vias (e.g., between via 220A and via 220B) and filled with conductive material 226. Returning to FIG. 2, trench 224 and conductive material 226 may provide a horizontally displaced connection between conductive material layer 216B (at the interface between build-up layer 204B and build-up layer 204C) and conductive material layer 216C (at the interface between build-up layer 204C and build-up layer 204D). Via 220D and conductive material 222D in build-up layer 204D may provide connection to the surface (e.g., a pad at the surface) at conductive material layer 216D for conductive material 226 in trench 224 (through the connection between conductive material 226 and conductive material layer 216C).

While FIGS. 2-4 show trench 224 providing a horizontally displaced connection between vias, trenches may also be implemented in other arrangements to provide horizontally displaced connections between other structures. For example, a trench may be formed between a via and another structure in a build-up layer and filled with conductive material. In some embodiments, a trench may be formed in an outermost build-up layer (e.g., the build-up layer that is directly connected to another device such as build-up layer 204D in FIG. 2). Providing a trench in the outermost build-up layer may provide redundant connections for pads on top of the build-up layer that may be connected to a ball grid array (BGA) or another surface mounted device. The trench and the redundant connections may provide a higher conductive material cross-sectional area for high current ground and power rails. Having the trench with a flat profile may also improve connectivity and reliability between a solder ball and the trench.

Trenches may also be implemented that extend from a via to outside the build-up layer (e.g., a trench may fan out from a via in the build-up layer). FIG. 5 depicts a top-view representation of an embodiment of PCB 500 with trenches 224 fanning out from vias 220 in build-up layer 204. FIG. 6 depicts an angle-view representation of the embodiment depicted in FIG. 5.

Figure 7:
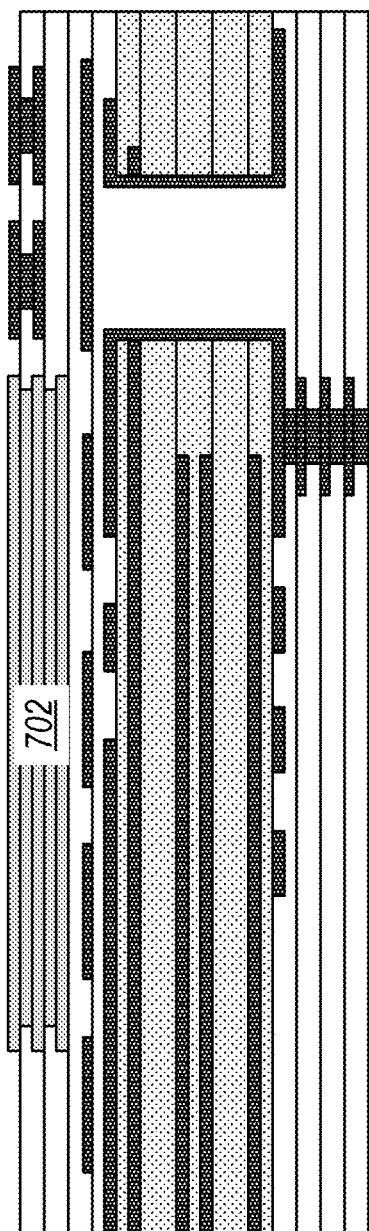
FIG. 7 depicts a cross-sectional side-view representation of an embodiment of a PCB with a trench stack.
Figure 8:
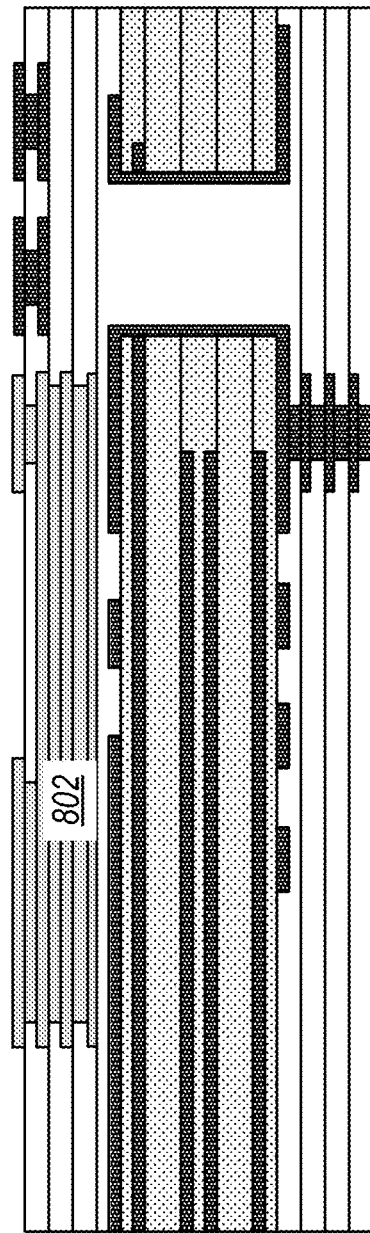
FIG. 8 depicts a cross-sectional side-view representation of another embodiment of a PCB with a trench stack.

Examples of other contemplated embodiments for trench implementations are depicted in FIGS. 7-8. For simplicity in FIGS. 7-8, labels are only provided for the trench implementations. FIG. 7 depicts a cross-sectional side-view representation of an embodiment of PCB 700 with trench stack 702. Trench stack 702 includes trenches filled with conductive material in the two outermost build-up layers. Trench stack 702 provides a substantially flat surface (e.g., a flat pad) on the outermost surface of PCB 700 for coupling to a surface mount device or another device.

FIG. 8 depicts a cross-sectional side-view representation of an embodiment of PCB 800 with trench stack 802. Trench stack 802 includes trenches filled with conductive material in the three outermost build-up layers where the buried trenches (trenches in $2^{nd}$ and $3^{rd}$ outermost layers) are wider than the trench in the outermost layer. The buried trenches also connect to a via in the outermost build-up layer. Trench stack 802 provides a substantially flat surface (e.g., a flat pad) on the outermost surface of PCB 800 along with a horizontally displaced connection at the via that is connected by the buried trenches.

Implementing one or more trenches with conductive material in build-up layers in a PCB may increase the conductive material cross-section in a given volume within the PCB. Since current density is current divided by conductive cross-sectional area, the implementation of the trenches with additional conductive material may decrease the conductive material current density. This decrease in current density may allow higher density of traces through the PCB while maintaining current density within maximum current density limits for functionality, reliability, and thermal reasons. Different depths of trenches and different stacking of trenches may also be implemented to provide a variety of connections within the PCB.

Figure 9:
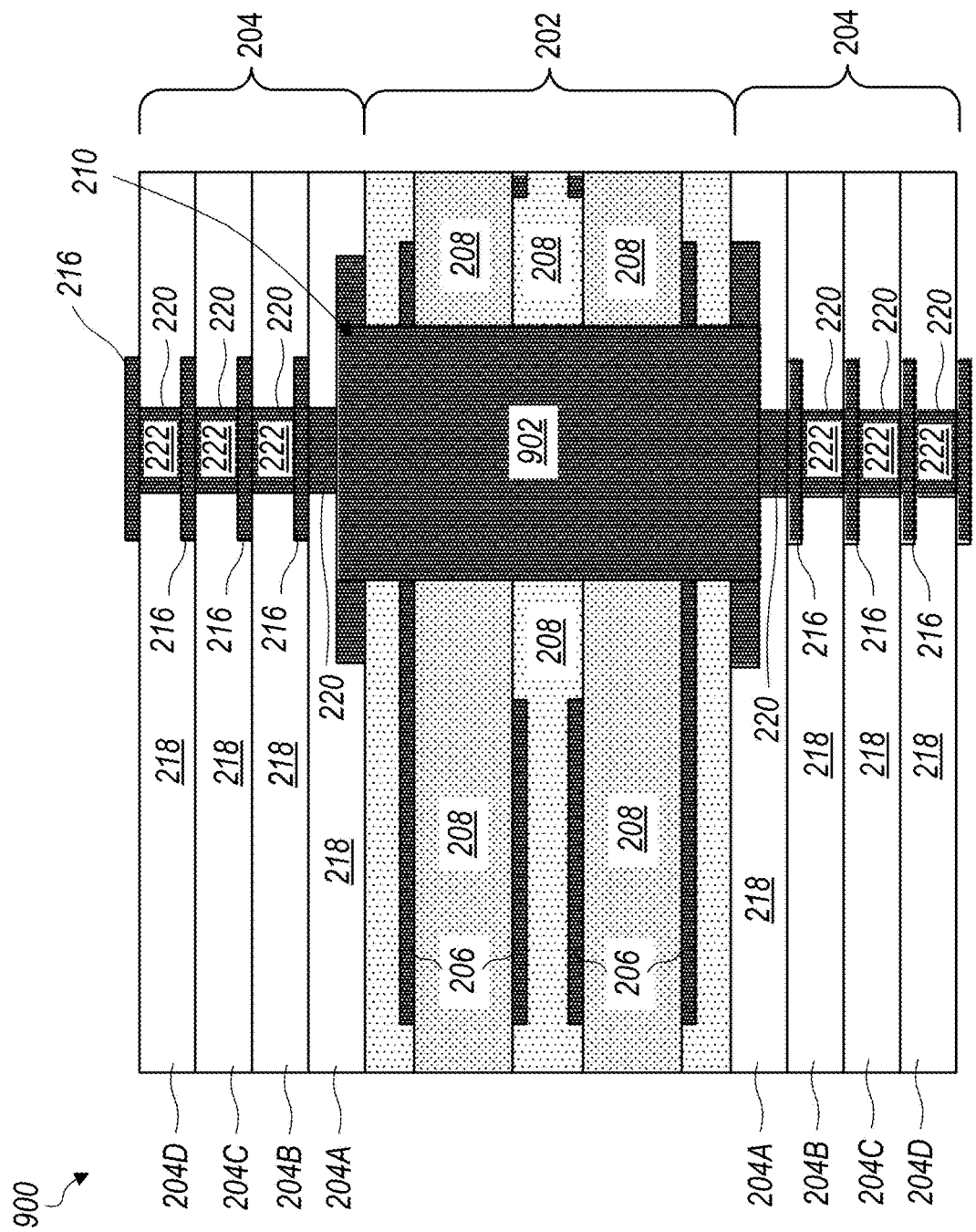
FIG. 9 depicts a cross-sectional side-view representation of an embodiment of a PCB with a filled buried via in a core layer.

Filling larger areas with conductive material inside a PCB may also be applied other layers in the PCB. For example, larger cross-sectional areas of conductive material may be formed in buried-vias within core layers of a PCB. FIG. 9 depicts a cross-sectional side-view representation of an embodiment of PCB 900 with a filled buried via in core layers 202. As shown in FIG. 9, via 210 (e.g., the buried via) is filled with conductive material 902. Conductive material 902 may substantially fill via 210 between vias 220 in build-up layers 204A above and below core layers 202.

As described above, via 210 may be formed by mechanical drilling through core layers 202 and via 210 may have a diameter of between about 160 µm and about 240 µm. Via 210 may be substantially filled with conductive material 902 using one or more electroplating processes, as described herein. FIG. 10 depicts a cross-sectional side-view representation of an embodiment of a via in core layers 202 in PCB 900. The embodiment of core layers 202 shown in FIG. 10 is the core layers during processing of the core layers and before build-up layers are coupled to the core layers.

As shown in FIG. 10, via 210 is formed through core layers 202. Seed layer 1000 is formed along the wall of via 210. Seed layer 1000 may be conductive material. In certain embodiments, seed layer 1000 is formed using an electroless plating process. In some embodiments, seed layer 1002 on the upper and lower surfaces of core layers 202 is formed in combination with seed layer 1000 along the wall of via 210. Seed layer 1002 may be, for example, an annular ring of conductive material around via 210. Seed layer 1000 and seed layer 1002 may have thicknesses that vary between about 1 µm and about 10 µm.

After formation of seed layer 1000 and seed layer 1002, via 210 may be filled with conductive material 902, as shown in FIG. 11. In certain embodiments, via 210 is filled using an electrolytic plating process that utilizes seed layers 1000, 1002 for the electrolytic process. In some embodiments, via 210 is substantially filled with conductive material 902, as shown in FIG. 11. "Substantially" filling via 210 with conductive material 902 includes filling the via such that the conductive material is flat as possible on both the upper and lower surfaces (e.g., the top and bottoms of the conductive material are flat as possible at or near the top and bottoms of the via). In certain embodiments, substantially filling via 210 with conductive material 902 includes limiting or reducing a dimple or recess at the top and bottom of the conductive material. For example, a size of the dimple at the top or bottom of conductive material 902 may have a maximum allowable size. In some embodiments, the maximum allowable size of a dimple is about 15 µm, though the allowable size may vary based on the design parameters of PCB 900. While the plating process shown in FIGS. 10 and 11 is for filling via 210 with conductive material 902, the plating process may also be applied to filling trench 224 with conductive material 226, described above.

After substantially filling via 210 with conductive material 902, build-up layers 204 may be coupled to core layers 202, as shown in FIG. 9. In the illustrated embodiment, conductive material 902 is coupled to vias 220 directly above and below via 210. Coupling vias 220 directly above and below via 210 is possible in PCB 900 because the filling of via 210 with conductive material 902 provides conductive material to connect to vias 220 near the middle of via 210. Having conductive material 902 within via 210 also provides mechanical strength to support vias 220 above and below via 210.

Figure 12:
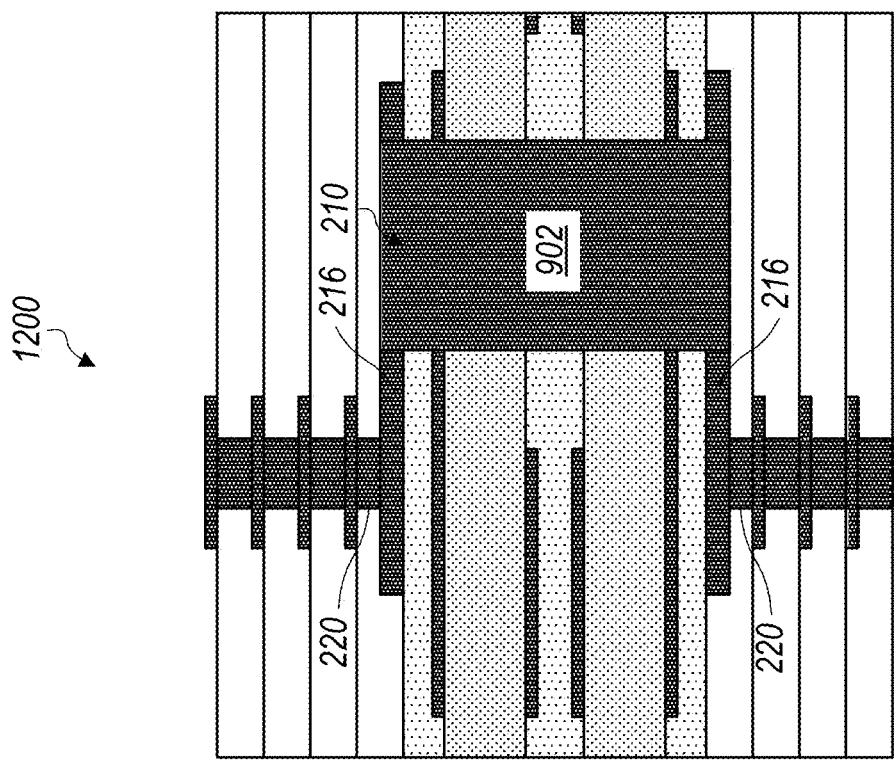
FIG. 12 depicts a cross-sectional side-view representation of another embodiment of a PCB.

Other embodiments with conductive material 902 in via 210 may also be contemplated. For example, FIG. 12 depicts a cross-sectional side-view representation of an embodiment of PCB 1200 with filled core via and staggered laser vias on build up layers. PCB 1200 includes via 210 filled with conductive material 902 with vias 220 in in a staggered configuration. The staggered configuration horizontally displaces vias 220 from via 210 (similar to the example PCB depicted in FIG. 1). Conductive material layer 216 may provide connection between conductive material 902 and vias 220.

Figure 13:
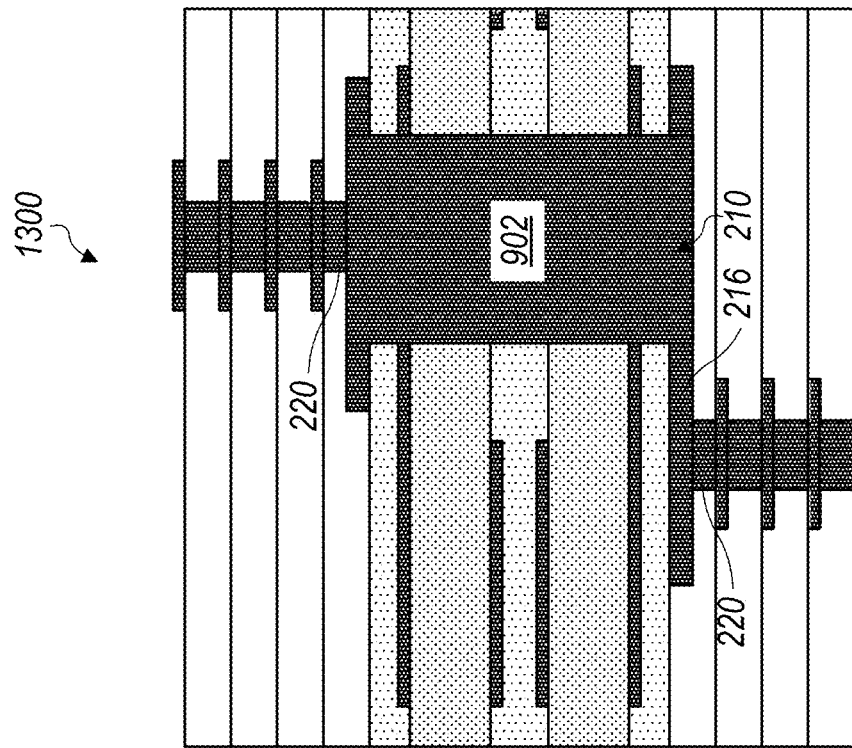
FIG. 13 depicts a cross-sectional side-view representation of yet another embodiment of a PCB with filled core via and both stacked and staggered laser vias on build-up layers.

FIG. 13 depicts a cross-sectional side-view representation of an embodiment of PCB 1300 with filled core via and both stacked and staggered laser vias on build up layers. PCB 1300 includes via 210 filled with conductive material 902 with vias 220 in in a half-staggered configuration. In the half-staggered configuration, only one stack of vias 220 (e.g., the lower vias 220) is horizontally displaced from via 210. Conductive material layer 216 provides connection between conductive material 902 and vias 220 that are staggered.

As shown in the embodiments depicted in FIGS. 9, 12, and 13, filling via 210 (e.g., the buried via) with conductive material 902 greatly increases the cross-sectional area of conductive material within the PCB. Increasing the cross-sectional area of conductive material inside a PCB allows more current to be carried with less resistance, thereby generating less resistive heating within the PCB. Generating less resistive heating may provide lower temperature operation of PCB and devices coupled to the PCB. In some embodiments, conductive material 902 in via 210 may act as a heat sink in the PCB. For example, conductive material 902 may carry heat from one side of the PCB to another side of the PCB (e.g., to a side with more airflow or cooling).

In some embodiments, providing conductive material 902 in via 210 increases the mechanical strength of the PCB. Conductive material 902 may, for example, make the PCB stiffer. Additionally, conductive material 902 may inhibit peel up or delamination in situations with large thermal expansion mismatch between materials in the PCB, thereby increasing reliability of the PCB.

Figure 14:
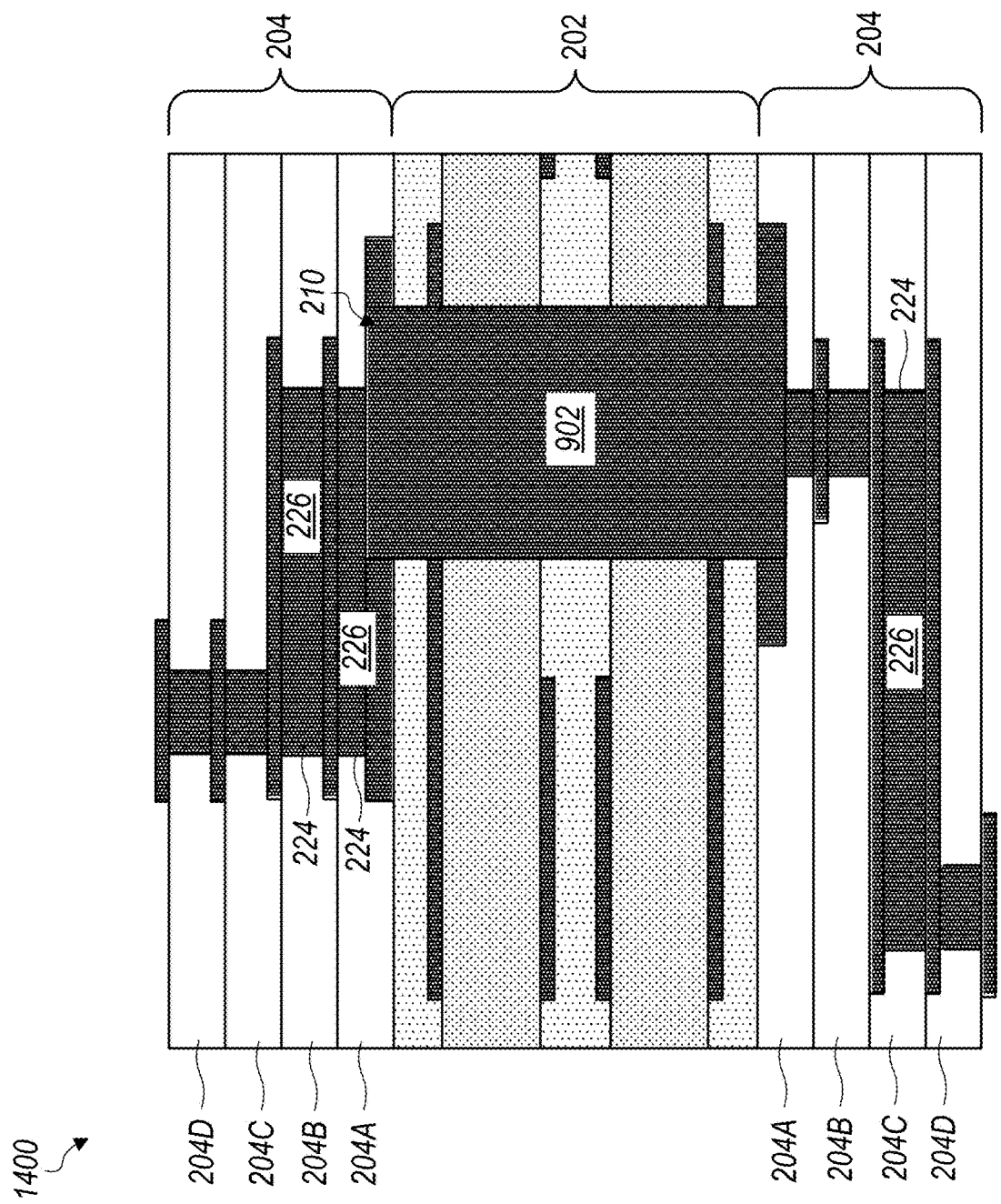
FIG. 14 depicts a cross-sectional side-view representation of yet another embodiment of a PCB with filled core via and both stacked and staggered laser vias on build-up layers, and buried trenches or shapes on build up layers.

In some embodiments, implementations of conductive material 902 filling via 210 (e.g., the buried via) in core layers 202 may be combined with implementations of trench 224 filled with conductive material 226 in build-up layers 204. FIG. 14 depicts a cross-sectional side-view representation of an embodiment of PCB 1400 with filled core via and both stacked and staggered laser vias on build up layers, buried trenches or shapes on build up layers. PCB 1400 implements both conductive material 902 filling via 210 and trenches 224 filled with conductive material 226 in build-up layers 204A, 204B above core layers 202 and trench 224 filled with conductive material 226 in build-up layer 204C below the core layers. Trenches 224 may be stacked on via 210 due to the increased mechanical strength provided by conductive material 902 in via 210.

Combining the implementation of conductive material 902 filling via 210 in core layers 202 with the implementation of trenches 224 filled with conductive material 226 in build-up layers 204 may provide further increases in cross-sectional area of conductive material in PCB 1400. The increased cross-sectional area of conductive material in PCB 1400 may provide reduced resistance, increased mechanical strength, and increased thermal reliability in the PCB. While various embodiments are described for conductive material 902 filling via 210 in core layers 202 or trenches 224 filled with conductive material 226 in build-up layers 204, numerous variations of PCBs that implement conductive material 902 filling via 210 and/or trench 224 filled with conductive material 226 may be contemplated based on the disclosed embodiments.

Figure 15:
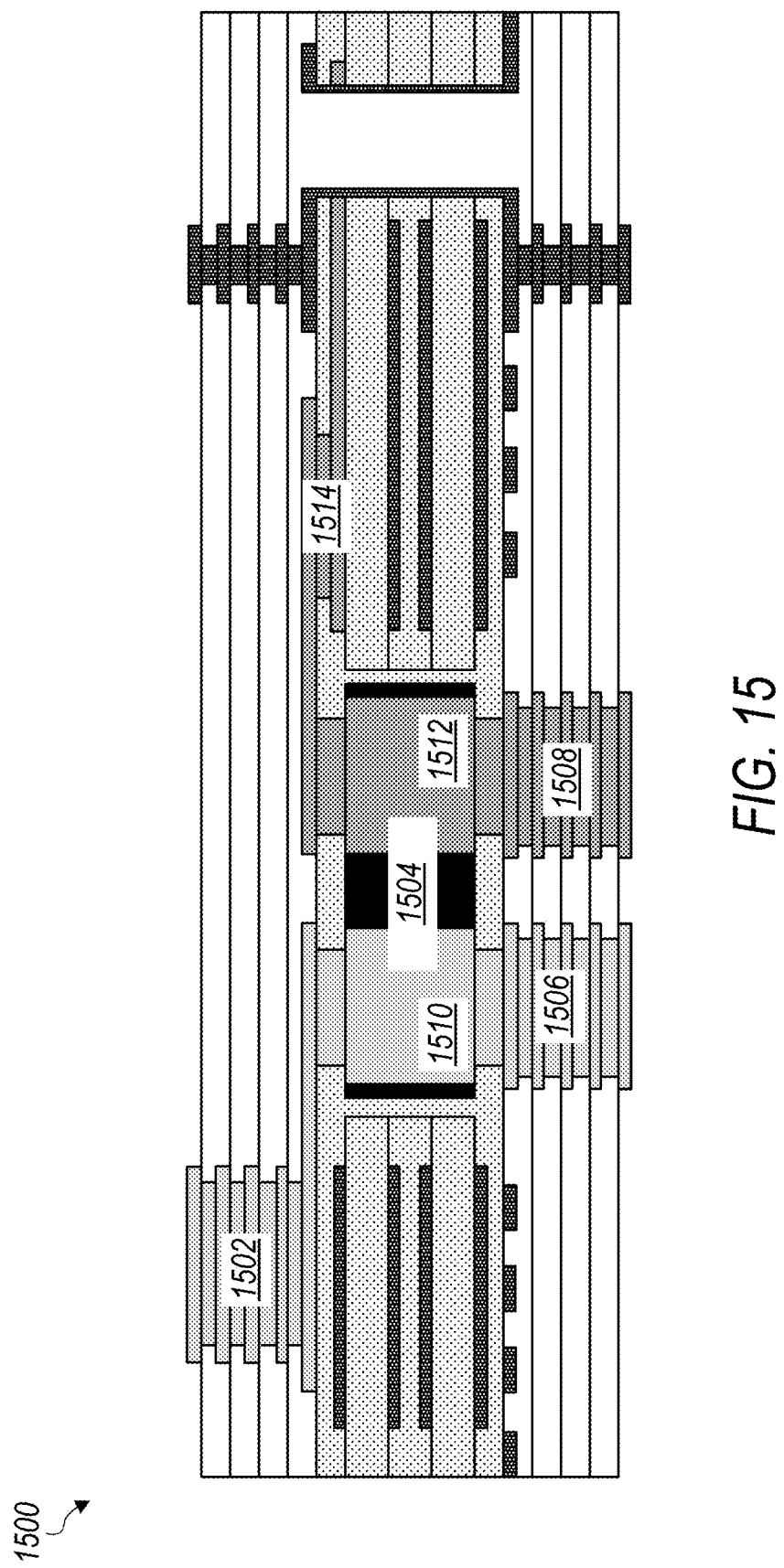
FIG. 15 depicts a cross-sectional side-view representation of an embodiment of a PCB with a trench stack and a via stack.

FIG. 15 depicts a cross-sectional side-view representation of an embodiment of PCB 1500 with trench stack 1502 and via stack 1504. Trench stack 1502 includes trenches filled with conductive material in the upper build-up layers. Trench stack 1502 provides a substantially flat surface on the outermost surface of PCB 1500 for coupling to a surface mount device or another device. Via stack 1504 includes trench stack 1506 connected to filled via 1510 and trench stack 1508 connected to filled via 1512. Via stack 1504 provides a heavy conductive material filled via inside PCB 1500 for high current operation. In some embodiments, trench stack 1508 and filled via 1512 are coupled to trench stack 1514 to provide a pseudo-component within PCB 1500.

Example Processing Methods

FIG. 16 is a flow diagram illustrating a method for forming a trench filled with conductive material in a build-up layer, according to some embodiments. Method 1600 may be implemented for any of the embodiments of trench 224 filled with conductive material 226, disclosed herein.

At 1602, in the illustrated embodiment, a build-up layer is formed by laminating layers (e.g., dielectric layers) together. The build-up layer may also be laminated onto another layer during a PCB fabrication process. The build-up layer may be laminated, for example, onto core layers or another build-up layer.

At 1604, in the illustrated embodiment, a laser drill is implemented to form trench 224. For example, as described herein, the laser drill may be used to create overlapping vias 230 that form trench 224.

At 1606, in the illustrated embodiment, electroless plating is used to form a seed layer in trench 224. The seed layer may be a conductive material layer with a thickness between about 1 μm and about 10 μm.

At 1608, in the illustrated embodiment, trench 224 is substantially filled with conductive material 226 using electrolytic plating. The seed layer formed in 1606 may be used as a catalytic surface for the electrolytic plating.

At 1610, in the illustrated embodiment, the build-up layer is patterned and etched into its final form. Patterning and etching may include, for example, conductive material trace formation in the build-up layer. After pattern and etching, additional processing to finalize the PCB may be implemented.

FIG. 17 is a flow diagram illustrating a method for filling a buried via with conductive material in core layers, according to some embodiments. Method 1700 may be implemented for any of the embodiments of via 210 filled with conductive material 902, disclosed herein.

At 1702, in the illustrated embodiment, core layers are formed by laminating layers (e.g., dielectric layers) together. During the lamination steps, conductive material traces (e.g., copper traces such as copper planes) may be formed between dielectric layers, as shown in the disclosed embodiments.

At 1704, in the illustrated embodiment, a mechanical drill is implemented to form via 210 (e.g., the buried via). The mechanical drill may be used drill through all the layers in the core layers.

At 1706, in the illustrated embodiment, electroless plating is used to form a seed layer along the wall of via 210. The seed layer may be a conductive material layer with a thickness between about 1 μm and about 10 μm.

At 1708, in the illustrated embodiment, via 210 is substantially filled with conductive material 902. For example, via 210 may be substantially filled with conductive material 902 using electrolytic plating. The seed layer formed in 1706 may be used as a catalytic surface for the electrolytic plating. In some embodiments, via filling 1708 includes multiple processes, which may include two or more plating processes. For example, a first electrolytic plating process may be used to form a "bridge" across via 210 in 1708A. A second electrolytic plating process (or another plating process) may then be used to fill via 210 with conductive material 902 from the bridge out in 1708B. In some embodiments, via filling 1708 may include planarization in 1708C to form planarized surfaces for conductive material 902.

At 1710, in the illustrated embodiment, the core layers are patterned and etched into its final form. Patterning and etching may include, for example, conductive material trace formation on the upper and lower surfaces of the core layers. After pattern and etching, additional processing to finalize the PCB may be implemented including the formation of build-up layers.

Numerous variations and modifications will become apparent to those skilled in the art once the above disclosure is fully appreciated. It is intended that the following claims be interpreted to embrace all such variations and modifications.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A circuit board, comprising:
    a core layer, wherein the core layer include at least one first dielectric layer and at least one first conductive material layer;
    a plurality of build-up layers coupled to the core layer, wherein the build-up layers include at least one second dielectric layer and at least one second conductive material layer, wherein the build-up layers include at least a first build-up layer, a second build-up layer vertically adjacent the first build-up layer, and a third build-up layer vertically adjacent the secohnd build-up layer;
    a first via through the first build-up layer at a first horizontal position on the printed circuit board;
    a first conductive material filling the first via and coupled to the at least one build-up conductive material layer of the first build-up layer;
    a second via through the third build-up layer at a second horizontal position on the printed circuit board, the second horizontal position being horizontally displaced from the first horizontal position;
    a second conductive material filling the second via and coupled between the at least one build-up conductive material layer of the second build-up layer and the at least one build-up conductive material layer of the third build-up layer;
    a plurality of overlapping vias through the second build-up layer that extend from the first horizontal position of the first via to the second horizontal position of the second via, wherein the plurality of overlapping vias form a trench through the second build-up layer; and
    a third conductive material filling the plurality of overlapping vias, wherein the third conductive material couples the at least one build-up conductive material layer of the first build-up layer to the at least one build-up conductive material layer of the second build-up layer.

2. The printed circuit board of claim 1, wherein the third conductive material is coupled to at least one surface connection on the plurality of build-up layers by the at least one build-up conductive material layer of the second build-up layer, the second conductive material, and the at least one build-up conductive material layer of the third build-up layer.

3. The printed circuit board of claim 2, wherein the at least a portion of the third conductive material is horizontally displaced relative to the at least one surface connection.

4. The printed circuit board of claim 1, wherein the plurality of overlapping vias includes laser drilled vias through the second build-up layer.

5. The printed circuit board of claim 1, wherein the plurality of overlapping vias include vias with a diameter between about 50 μm and about 150 μm.

6. The printed circuit board of claim 1, wherein the third conductive material provides a fan out connection in the at least one build-up dielectric layer of the second build-up layer.

7. The printed ciruit board of claim 1, wherein the trench has a rectilinear shape from the first horizontal position of the first via to the second horizontal positioin of the second via.

8. The printed circuit board of claim 1, further comprising:
    a buried via through the core layer; and
    a fourth conductive material filling the buried via, wherein the fourth conductive material substantially fills the buried via.

9. A printed circuit board, comprising:
    core layers, wherein the core layers include at least one core dielectric layer, a first core conductive material layer proximate an upper vertical surface of the core layers, and a second core conductive material layer proximate a lower vertical surface of the core layers;
    a plurality of build-up layers coupled to the core layer, wherein the build-up layers include at least one build-up dielectric layer and at least one build-up conductive material layer;
    a plurality of overlapping vias through at least one of the build-up layers, wherein the plurality of overlapping vias extend from a first horizontal position of a first via connected to the build-up layer vertically above the overlapping vias to a second horizontal position of a second via connected to the build-up layer vertically below the overlapping vias, the second horizontal position being horizontally displaced from the first horizontal position, wherein the plurality of overlapping vias form a trench through the at least one build-up layer;
    a buried via throught the core layers; and
    a third conductive material filling the plurality of overlapping vias and the buried via, wherein the third conductive material filling the buried via has an upper vertical surface vertically above the first core conductive material layer of the core layers and a lower vertical surface vertically below the second core conductive material of the core layers.

10. The printed circuit board of claim 9, wherein the third conductive material filling the plurality of overlapping vias is coupled to at least one surface connection on the plurality of build-up layers.

11. The printed circuit board of claim 9, wherein the build-up layers include at least a first build-up layer, a second build-up layer vertically adjacent the first build-up layer, and a third build-up layer vertically adjacent the second build-up layer, wherein the plurality of overlapping vias are in the second build-up layer, and wherein the first build-up layer includes:

a first via through the first build-up layer at the first horizontal position on the printed circuit board;

the third conductive material filling the first via in addition to the buried via and the plurality of overlapping vias in the second build-up layer; and wherein the third conductive material filling the plurality of overlapping vias connects to the third build-up layer at the second horizontal position.

12. The printed circuit board of claim 11, wherein the third build-up layer includes:

a second via through the third build-up layer at the second horizontal position on the printed circuit board; and a fourth conductive material filling the second via and coupled between the at least one build-up conductive material layer of the second build-up layer and the at least one build-up conductive material layer of the third build-up layer.

13. The printed circuit board of claim 9, wherein a first end of the plurality of overlapping vias is positioned in horizontal alignment with the buried via and a second end of the plurality of overlapping vias is horizontally offset from the buried via.

14. A printed circuit board, comprising: core layers, wherein the core layers include at least one core dielectric layer separating a first core conductive material layer proximate an upper vertical surface of the core layer and a second core conductive material layer proximate a lower vertical surface of the core layers; a plurality of build-up layers coupled to the core layer, wherein the build-up layers include at least one build-up dielectric layer and at least one build-up conductive material layer; a plurality of overlapping vias through at leat one of the build layers, wherein the plurality of overlapping vias form a trench that extends from a first horizontal position of a first via in the plurality of overlapping vias that is connected to the build-up layer vertically above the overlapping vias to a second horizontal position of a last via in the plurality of overlapping vias that is connected to the build-up layer vertically below the overlapping vias, the second horizontal position being horizontally displaced from the first horizontal position, wherein the trench has a first interface between the at least one of the build-up layers and the build-up layer vertically above the overlapping vias and a second interface between the at least one of the build-up layers and the build-up layer vertically below the overlapping vias, and wherein the trench has a flat profile at the first interface and at the second interface along its length between the first horizontal position and the second horizontal position; and a third conductive material filling the trench.

15. The printed circuit board of claim 14, wherein the third conductive material filling the plurality of overlapping vias is coupled to at least one surface connection on the plurality of build-up layers.

16. The printed circuit board of claim 14, wherein the build-up layers include at least a first build-up layer, a second build-up layer vertically adjacent the first build-up layer, and a third build-up layer vertically adjacent the second build-up layer, wherein the plurality of overlapping vias are in the second build-up layer, and wherein the first build-up layer includes:

a first via through the first build-up layer at the first horizontal position on the printed circuit board;

the third conductive material filling the first via in addition to the plurality of overlapping vias in the second build-up layer; and wherein the third conductive material filling the plurality of overlapping vias connects to the third build-up layer at the second horizontal position.

17. The printed circuit board of claim 16, wherein the third build-up includes:

a second via through the third build-up layer at the second horizontal position on the printed circuit board; and a fourth conductive material filling the second via and coupled between the at least one build-up condutive material layer of the second build-up layer and the at least one build-up conductive material layer of the third build-up layer.

\* \* \* \* \*

UNITED STATES PATENT AND TRADEMARK OFFICE
CERTIFICATE OF CORRECTION

PATENT NO. : 11,956,898 B2
APPLICATION NO. : 17/119126
DATED : April 9, 2024
INVENTOR(S) : Anne M. Mason et al.

It is certified that error appears in the above-identified patent and that said Letters Patent is hereby corrected as shown below:

In the Claims

Column 13, Line 27, delete "circuit board" and insert --printed circuit board--.
Column 13, Line 28, delete "layer include" and insert --layer includes--.
Column 13, Line 29, delete "first dielectric" and insert --core dielectric--.
Column 13, Line 29, delete "first conductive" and insert --core first conductive--.
Column 13, Line 32, delete "one second" and insert --one build-up--.
Column 13, Line 33, delete "one second" and insert --one build-up--.
Column 13, Line 37, delete "secohnd" and insert --second--.
Column 14, Line 1, delete "the at least" and insert --at least--.
Column 14, Line 17, delete "ciruit" and insert --circuit--.
Column 14, Line 19, delete "positioin" and insert --position--.
Column 14, Line 49, delete "throught" and insert --through--.
Column 15, Line 32, delete "leat one of the build" and insert --least one of the build-up--.
Column 16, Line 31, delete "build-up" and insert --build-up layer--.
Column 16, Line 35, delete "condutive" and insert --conductive--.

Signed and Sealed this
Ninth Day of July, 2024

Katherine Kelly Vidal
*Director of the United States Patent and Trademark Office*